United States Patent [19]

Stewart et al.

[11] Patent Number: 4,947,221
[45] Date of Patent: Aug. 7, 1990

[54] MEMORY CELL FOR A DENSE EPROM

[75] Inventors: Roger G. Stewart, Hillsborough Township, Somerset County; Alfred C. Ipri, Hopewell Township, Mercer County; Louis S. Napoli, Hamilton Township, Mercer County, all of N.J.

[73] Assignee: General Electric Company, Schenectady, N.Y.

[21] Appl. No.: 940,167

[22] Filed: Dec. 10, 1986

Related U.S. Application Data

[63] Continuation of Ser. No. 803,005, Nov. 29, 1985, abandoned.

[51] Int. Cl.$^5$ ............... H01L 29/78; H01L 29/34
[52] U.S. Cl. .................................. 357/23.5; 357/54
[58] Field of Search ............... 357/23.5, 54; 365/185

[56] References Cited

U.S. PATENT DOCUMENTS

| | | | |
|---|---|---|---|
| 3,984,822 | 10/1976 | Simko et al. | 357/23.5 |
| 4,272,774 | 6/1981 | Boettcher | 357/23.5 |
| 4,295,150 | 10/1981 | Adam | 357/23.5 |
| 4,332,077 | 6/1982 | Sheng Teng Hsu | 29/571 |
| 4,519,849 | 5/1985 | Korshetol | 357/91 |
| 4,577,215 | 3/1986 | Stewart et al. | 357/23.6 |

FOREIGN PATENT DOCUMENTS

| | | | |
|---|---|---|---|
| 0123249 | 10/1984 | European Pat. Off. | 365/185 |
| 59-99760 | 6/1984 | Japan | 357/23.5 |

OTHER PUBLICATIONS

R. M. Anderson et al., "Evidence for Surface Asperity Mechanism of Conductivity in Oxide Grown on Polycrystalline Silicon", *Journal of Applied Physics*, vol. 43 (1977), pp. 4834–4836.

*Primary Examiner*—J. Carroll
*Attorney, Agent, or Firm*—James C. Davis, Jr.; Paul R. Webb, II

[57] ABSTRACT

A memory cell has a first capacitance between a floating gate and a channel region and a second capacitance between a control gate and the floating gate. The second capacitance is less than said first capacitance, preferably much less, and there is self-alignment in two directions, resulting in a compact cell. The floating gate can have a textured surface facing the control gate. The control gate can also shift the cell operation from the enhancement mode into the depletion mode.

1 Claim, 3 Drawing Sheets

MEMORY CELL FOR A DENSE EPROM

This is a continuation of application Ser. No. 803,005, filed 11/29/85 abandoned.

BACKGROUND OF THE INVENTION

The present invention relates to a memory cell for an eraseable programmable read only memory (EPROM), and more particularly to an EPROM that is designed to have a high density of memory cells.

An EPROM comprises a plurality of memory cells. Each of said cells typically comprises a transistor having spaced source and drain regions, with a channel region therebetween. Above the channel region is a floating gate, and above the floating gate is control gate. Due to the type of programming used in the prior art, it is necessary to have a relatively large capacitance between the gates and a smaller capacitance between the floating gate and the channel region. This necessitates a relatively large control gate and large floating gate, and therefore a relatively large cell area. A thinner insulating layer between the two gates cannot be used to increase the capacitance therebetween because greater tunnelling current therebetween would undesirably occur.

Further, a typical EPROM cell has avalanche effect currents flowing therein during the WRITE operation, which results in a relatively large power dissipation and permits writing only into a further enhanced mode, thereby increasing the required WRITE and READ circuitry. Still further, only a relatively small fraction of hot (channel current) electrons are transferred to the floating gate thereby contributing to a voltage change on the floating gate. These effects make the WRITE operation relatively slow and inefficient.

It is therefore desirable to have a memory cell that is small, requires a minimum of external circuitry, can be efficiently written in a short amount of time.

SUMMARY OF THE INVENTION

A transistor memory cell in accordance with the invention comprises spaced source and drain regions with a channel region therebetween. A floating gate is disposed above the channel region to form a first capacitance therewith and a control gate is disposed above the floating gate to form a second capacitance therewith. The second capacitance is less than the first capacitance, and there is self-alignment in two directions, resulting in a smaller cell area. The side of the floating gate facing the control gate can be textured to allow tunnelling currents to flow therebetween at low voltages, thereby reducing power dissipation during the WRITE operation and increasing the speed thereof. The tunnelling currents allow writing into the depletion mode from an enhancement mode. This permits sharing of common structures for controlling READ and WRITE operations, thus reducing the memory area.

DETAILED DESCRIPTION

Figure 1:
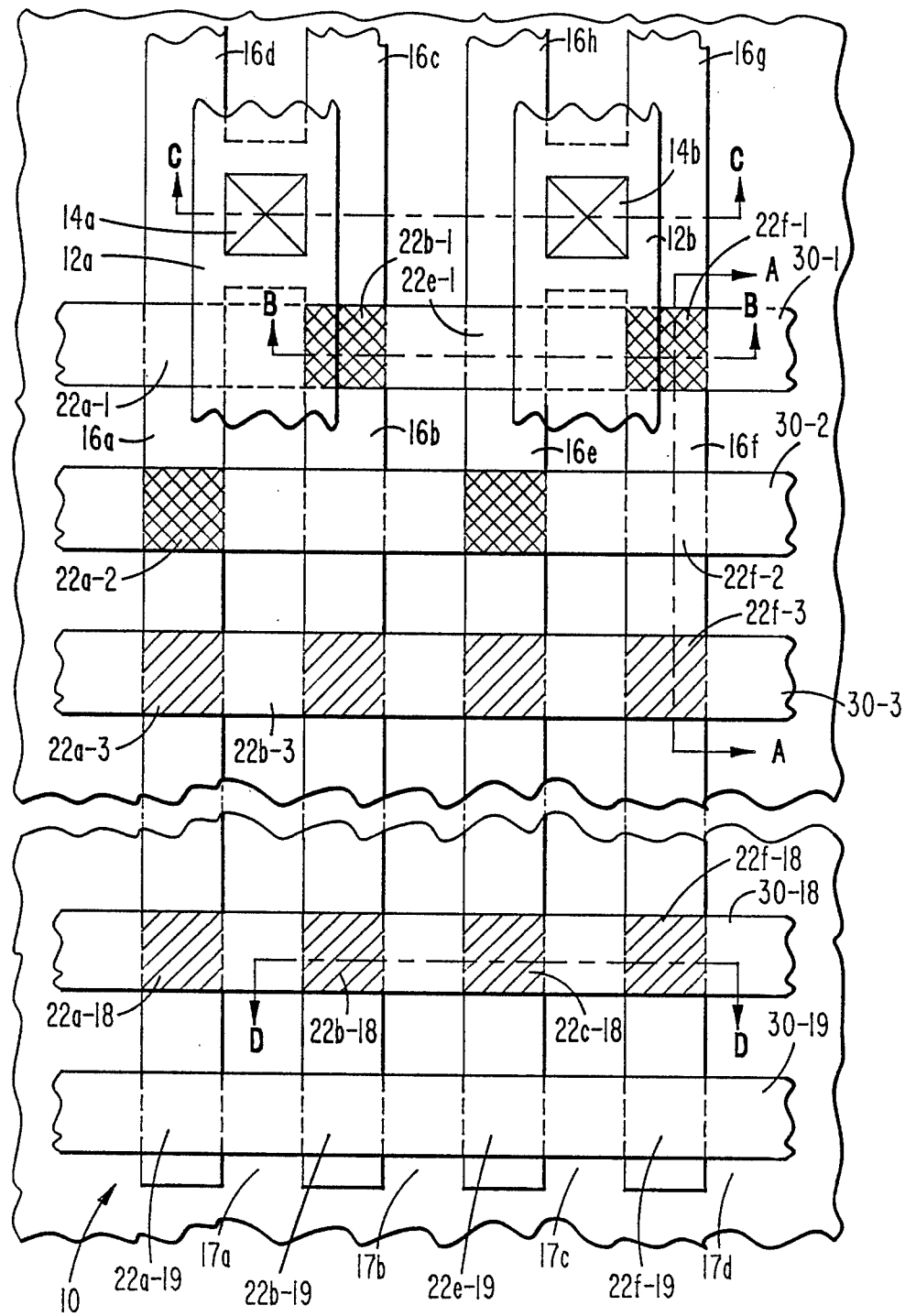
FIG. 1 is a top view of a portion of an EPROM.

FIG. 1 shows an EPROM 10 comprising conductive bit lines 12a and 12b, that extend from beneath the bottom of the FIG. to beyond the top thereof, only broken away portions being shown for the sake of clarity. The bit lines 12a and 12b are connected to conductive contacts 14a and 14b, respectively, (see also FIG. 2C). The contact 14a is connected to four active areas or memory stacks 16a, 16b, 16c, and 16d, while the contact 14b is connected to another four active areas 16e, 16f, 16g, and 16h in a substrate 18. All active areas 16 are coupled to a reference voltage, such as ground, at their ends remote from contact 14 by way of a ground bus 15.

Since each of the bit lines 12a and 12b is connected to four stacks or active areas 16, minimum design rules (maximum density) can be used for the active area pitch, e.g. about 2 micrometers ($\mu$m), while relaxed rules (non-maxium density) can be used for the conductive bit lines 12, i.e. 4 $\mu$m pitch, resulting in a higher yield.

The active areas 16 are isolated from each other by continuous field insulating regions (FIR) 17. In particular, FIR 17a isolates active regions 16a and 16b, FIR 17b isolates active regions 16b and 16e (as well as the regions 16c and 16h), FIR 17c isolates active regions 16e and 16f, and FIR 17d isolates active region 16f from an adjacent one (not shown). Field implant regions (not shown) are beneath the field insulating regions 17, as known in the art.

Figure 2A:
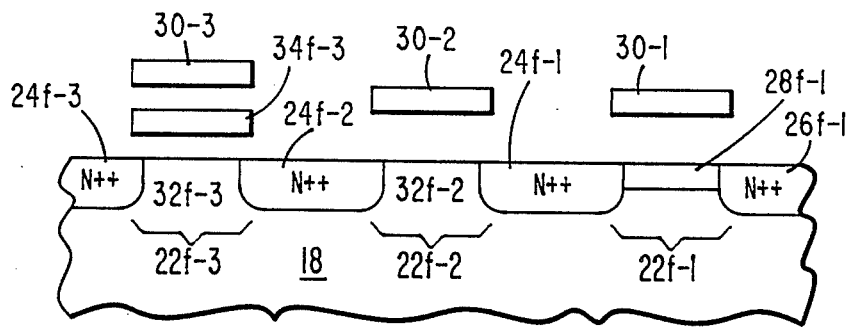
FIGS. 2A, B, C, and D show cross-sections taken along lines A—A, B—B, C—C, and D—D, respectively, of FIG. 1.

The active area 16f will now be considered in detail in conjunction with FIG. 2A, wherein insulating regions, have been omitted for clarity. The field effect transistor (FET) 22f-1 comprises source and drain regions 24f-1 and 26f-1, respectively, which are disposed in the substrate 18, with a shorted channel region 28f-1 therebetween. Thus the transistor 22f-1 is always ON (conducting). The transistor 22f-1, as well as other transistors with shorted channel regions (described below), are indicated in FIG. 1 by doubly hatched areas. Above the channel region 28f-1 is a control gate or word stack line 30-1 that also extends across the active areas 16a, 16b and 16e.

A transistor 22f-2 lies adjacent the transistor 22f-1 and comprises a source region 24f-2 with the region 24f-1 comprising the drain region thereof. A control gate or word stack line 30-2 overlies the conventional (not shorted) channel region 32f-2 between the regions 24f-2 and 24f-1.

A transistor 22f-3 lies adjacent the transistor 22f-2 and comprises a source region 24f-3 with the region 24f-2 comprising the drain region thereof. Above the conventional channel region 32f-3 is a floating gate 34f-3. This floating gate, as well as the other floating gates (described below), are shown as singly hatched areas in FIG. 1. A control gate or word bit line 30-3 lies above the floating gate 34f-3.

Figure 2B:
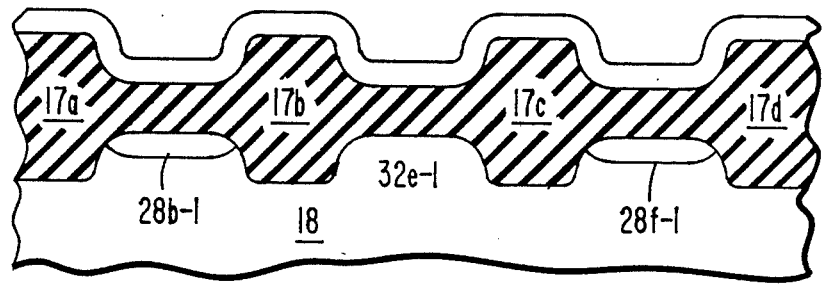
Figure 2C:
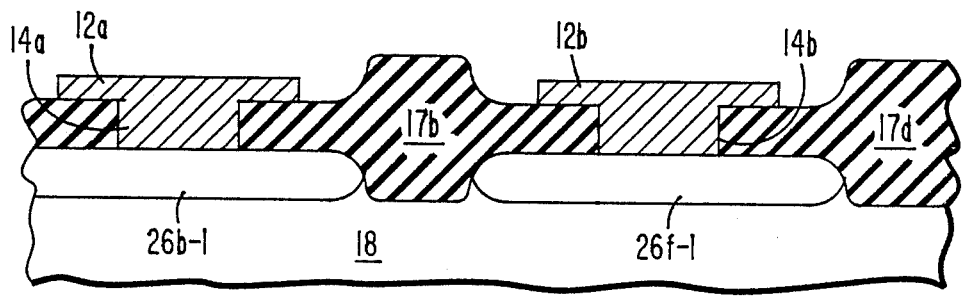
Figure 2D:
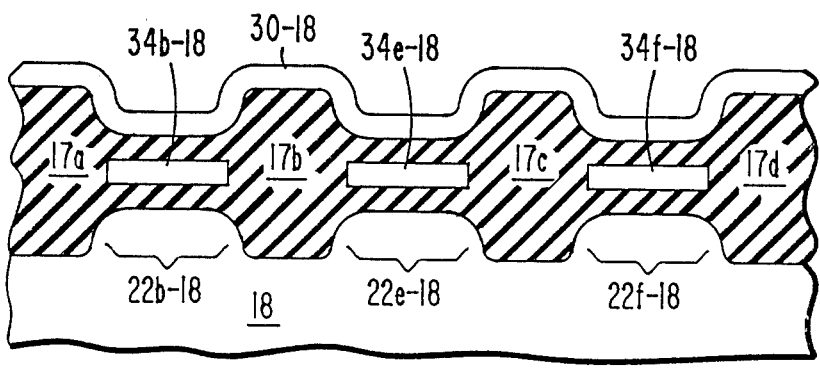

The transistor 22f-3 is the first memory cell in the active area 16f. By way of illustration there are a total of sixteen such identical memory cells in each stack or active area 16. For clarity only the first of said cells 22f-3 (described above) and the last of said cells 22f-18 are shown in FIG. 1. The transistor 22f-18 is controlled by control gate or word bit line 30-18 (FIG. 2D). The last transistor 22f-19 is a conventional, i.e. non-floating gate, ground isolation FET, which is controlled by control or ground isolation gate 30-19. The source (not shown) of transistor 22f-19 is grounded by the bus 15.

The transistors in active area 16e are identical to that in active area 16f (described above) except that the channel region 32e-1 of the transistor 22e-1 (FIG. 2B) is conventional, i.e. it is controlled by the word stack line 30-1, and the transistor 22e-2 is always ON due to a shorted channel region (not shown) thereof. The last memory cell in active area 16e is the transistor 22e-18, while the ground isolation transistor is the transistor 22e-19. The transistors in active area 16b are identical to that in active area 16e, i.e. the transistor 22b-1 is always ON due to the shorted channel region 28b-1 as shown in FIG. 2B, and the transistor 22b-2 is controlled by the word stack line 30-2. The transistors in active area 16a are identical to those in active area 16e. Thus the transistor 22a-1 is controlled by the word stack line 30-1 and the transistor 22a-2 is always ON due to a shorted channel region (not shown).

Figure 3:
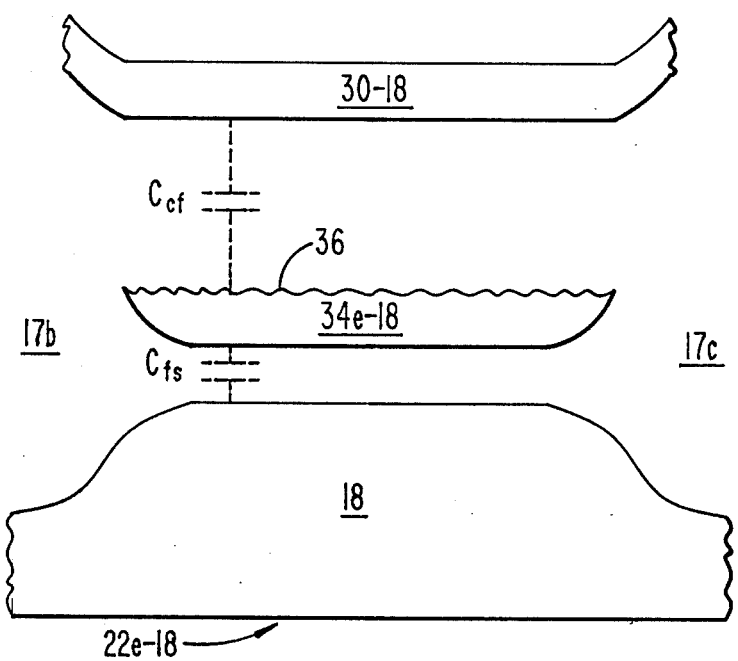
FIG. 3 is an enlarged cross-section of a transistor memory cell of FIG. 2D.

FIG. 3 shows the transistor 22e-18, the other transistors 22 having a floating gate being identical. The floating gate 34-18 is spaced from the substrate 18 by about 10 nanometers (nm) and has a capacitance with respect to the substrate designated as $C_{fs}$. The field insulating regions 17b and 17c have a positive taper (wider at the bottom of the floating gate 34e-18 than at the top thereof). U.S. Pat. Appl. Ser. No. 768,833, filed Aug. 23, 1985, discloses a method for making a transistor having such a taper. The top surface 36 of the floating gate 34e-18 is textured to reduce the barrier height to 1.25 electron volts so that electron tunneling is made easier. The word bit line 30-18 is about 280 nm above the floating gate 34e-18 and is self-aligned therewith in the length (source-to-drain direction) axis. Further, the floating gate 34e-18 is self-aligned with the field insulating regions 17b and 17c, and thus with the channel region of the transistor 22e-18, in the width axis. Due to this alignment in two axes, the transistor 22e-18 occupies a small area and is scalable. U.S. Pat. Application Serial No. 748,447, filed June 25, 1985, discloses a method for achieving such an alignment. The capacitance between the word bit line 30-18 and the floating gate 34e-18 is designate $C_{cf}$ and is less than the capacitance $C_{fs}$, preferably much less than $C_{fs}$. In a particular embodiment $C_{fs}$ is about 3 times greater than $C_{cf}$, i.e. about the ratio of the thickness of the insulating layers between the control gate 30-18 and floating gate 34e-18 and between the floating gate 34e-18 and the substrate 18 since the effective areas of the capacitors having said capacitances are equal.

A problem with the embodiment of FIG. 3 of the cell 22e-18 is that the distance between the floating gate 34e-18 and the substrate 18 cannot be made so small as to achieve a large value of the ratio $C_{fs}/C_{cf}$ since then a tunnelling current will occur therebetween. This current will limit the amount of charge stored on the floating gate 34e-18 during a WRITE operation (described below).

Figure 4:
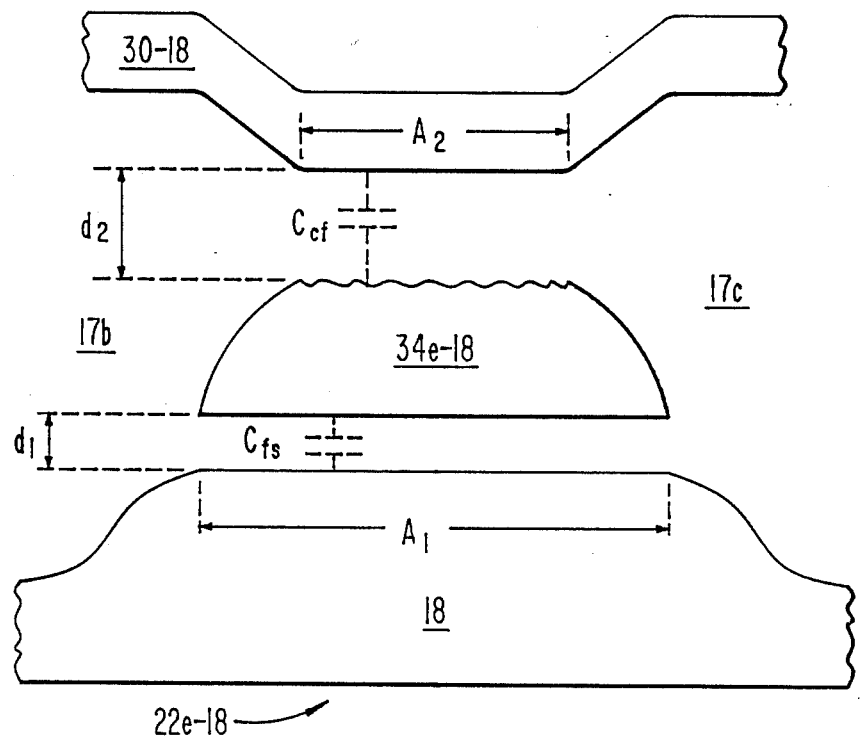
FIG. 4 is a cross-sectional view of an alternate embodiment of the cell of FIG. 3.

FIG. 4 shows an embodiment of the cell 22e-18 that avoids this problem, wherein the floating gate 34e-18 is wider at its bottom than at its top. Thus the effective area $A_1$ of the capacitor having the capacitance $C_{fs}$ is larger than the effective area $A_2$ of the capacitor having the capacitance $C_{cf}$. Further the spacing $d_1$ is smaller than the spacing $d_2$. Since capacitance is proportional to the effective area of a capacitor and inversely proportional to the spacing of the capacitor plates, the capacitance $C_{fs}$ is much greater than the capacitance $C_{cf}$. Thus for the embodiment of FIG. 4, $C_{fs}/C_{cf}$ will be desirably greater than the ratio of $d_2/d_1$ as in the embodiment of FIG. 3.

The conductive bit lines 12, and the contacts 14 can comprise a good conductor, such as aluminum. The active areas 16, the substrate 18 and the conventional channel regions 32 can comprise a lightly doped semiconductor, such as P$^-$ conductivity type silicon. The source and drain regions 24 and 26 and the ground bus 15 can comprise a very heavily doped semiconductor, such as N$^{++}$-conductivity type silicon. The shorted channel regions 28 can comprise a heavily doped semiconductor, such as N$^+$-conductivity type silicon. The field insulating regions 17 can comprise any insulator, such as silicon dioxide. The floating gates 34 and the control gates 30 can comprise a heavily doped semiconductor, such as N$^+$-conductivity type polycrystalline silicon (polysilicon) or microcrystalline silicon.

Now the operation of the EPROM 10 will be considered. The first operation is WRITE PRECHARGE. Zero volts is applied to the ground isolation gate line 30-19. This turns OFF the ground isolation transistors 22a-19, 22b-19, 22e-19, and 22f-19. Then 12.5 volts is applied to the bit lines 12, while 15 volts is applied to the word stack lines 30-1 and 30-2, and to the word bit lines 30-3 through 30-18. The channel regions 32 invert to become N-conductivity type and thus all the transistors are ON except for the ground isolation transistors. All the source and drain regions 24 and 26 now charge up about to 12.5 volts with respect to the substrate 18, which is grounded.

The next operation is DECODED DISCHARGE. The ground isolation transistors 22a-19, 22b-19, 22e-19, and 22f-19 are still OFF since zero volts is still applied to the gate line 30-19. If the active area 16e is selected for the WRITE operation, then its bit line 12b has zero volts applied to it, and its word stack line 30-1 has 5 volts applied thereto, turning ON the transistor 22e-1. The word bit lines 30-3 through 30-18 are set to 5 volts, thereby turning ON the transistors 22e-3 through 22e-18. Thus all of the charge stored in the source and drain regions 24 and 26 of the transistors 22e-3 through 22e-18 now goes to ground through the bit line 12b. Since the voltage on the word stack line 30-2 has zero volts applied thereto, the transistor 22f-2 is OFF. Thus the transistors 22f-3 through 22f-18 retain their stored charge. The non-selected bit line 12a has 5 volts applied thereto, and thus this voltage is also present at the source regions of the transistors 22a-1 and 22b-2. Since the word stack line 30-1 has 5 volts thereon, the transistor 22a-1 is OFF. Further, since the word stack line 30-2 has zero volts thereon, the transistor 22b-2 is OFF. Thus the transistors 22a-3 through 22a-18 and 22b-3 through 22b-18 retain their stored charge.

The WRITE PRECHARGE and DECODED DISCHARGE operations together comprise a DYNAMIC INHIBIT operation of the EPROM 10.

Thereafter the WRITE operation is performed. All of the ground isolation transistors 22a-19, 22b-19, 22e-19, and 22f-19 are still OFF since zero volts is still applied to the gate line 30-19. If it is desired to WRITE a "1" into the transistor 22e-18 of FIG. 3, then about 15 volts is applied to word bit line 30-18. The remaining word bit lines 30-3 through 30-17 have 5 volts applied thereto as does the word stack line 30-1 and the bit line 12a. The bit line 12b has zero volts applied thereto as does the word stack line 30-2. Thus the transistors 22e-1 and 22e-3 rough 22e-17 are ON and the transistor 22f-2 is OFF. Due to the electric field between the substrate 18 and the word bit line 30-18, the floating gate 34e-18 supplies electrons by Fowler-Nordleim tunneling to the word bit line 30-18. The voltage on the floating gate 34e-18 with respect to the substrate 18 increases from about zero volts to about +2 volts, thereby causing a threshold voltage shift of the transistor 22e-18 of about from +1 volt (enhancement mode device) to -7 volts (depletion mode device). The greater the value of $C_{fs}$ as compared to $C_{cf}$, the greater the shift in value of the voltage on the floating gate 34e-18. In order to WRITE a "0", then the word bit line 30-18 has 5 volts thereon, which is less than the voltage needed for the occurrence of a tunneling current. Thus the transistor 22e-2 remains an enhancement mode device.

If the charge supplied during DYNAMIC INHIBIT leaks away from the source and drain regions of stacks that are not being written before a full WRITE operation, i.e. fully charging the floating gate, on a particular cell can be performed, then a partial WRITE operation can be performed followed by DYNAMIC INHIBIT. This can be repeated as often as necessary to fully perform WRITE, i.e. fully charge the floating gate. If the charge on the source and drain regions of the nonselected stacks stays for a sufficient time, then several or possibly even all sixteen cells of the selected stack can be serially written without repeating DYNAMIC INHIBIT. Thereafter DYNAMIC INHIBIT followed by WRITE is repeated for the remaining stacks.

The last operation is READ. In order to read the transistor 22e-18, the bit lines 12a and 12b receive a voltage of 2.5 volts. A voltage of 5 volts is applied to the word stack line 30-1, to the word bit lines 30-3 through 30-17, and to the ground isolation gate 30-19. This turns ON the transistors 22e-1, 22e-3 through 22e-17, and 22e-19 regardless of whether they are storing a 0 or a L 1. The word bit line 30-18 has a voltage of zero volts applied thereto. If the floating gate 34b-18 has zero volts thereon (storing a 0), then no current flows on the bit line 12b since the transistor 22e-18 is an enhancement mode transistor which remains OFF. If the floating gate 34e-18 has +2 volts thereon (storing a 1), a current will flow in the active area 16e since the transistor 22e-18 is a depletion mode transistor. This current is sensed by a sense amplifier (not shown) connected to the bit line 12b. Thereafter the READ operation can be performed for the remaining cells of stack 16e. Then the READ operation can be performed for the remaining stacks. Sense amplifiers are respectively coupled to the remaining bit lines 12 for this purpose.

The EPROM 10 can be erased using ultraviolet light. If electrical erasure is desired, then the surfaces of the control gates 30 that face the floating gates 34 can be textured.

What is claimed is:

1. A transistor memory cell comprising:
   a substrate having spaced source and drain regions and a channel region therebetween;
   a first insulating layer disposed on said channel region;
   a floating gate disposed on said first insulating layer and coterminous with said channel region in the width axis of the transistor to form a first capacitor having a first capacitance with said substrate;
   a second insulating layer disposed on said floating gate; and
   a control gate disposed on said second insulating layer caterminous with said floating gate in the length axis of the transistor to form a second capacitor having a second capacitance with said floating gate, said second capacitance being less than said first capacitance, and wherein said first capacitor has a greater effective area and smaller spacing than said second capacitor.

* * * * *